United States Patent
Ausserlechner et al.

(10) Patent No.: US 8,063,632 B2
(45) Date of Patent: Nov. 22, 2011

(54) METHOD AND APPARATUS FOR DEFINED MAGNETIZING OF PERMANENTLY MAGNETIZABLE ELEMENTS AND MAGNETORESISTIVE SENSOR STRUCTURES

(75) Inventors: Udo Ausserlechner, Villach (AT); Thomas Bever, Munich (DE); Dirk Hammerschmidt, Villach (AT); Joachim Weitzel, Markt Indersdorf (DE)

(73) Assignee: Infineon Technologies AG, Neubiberg (DE)

( * ) Notice: Subject to any disclaimer, the term of this patent is extended or adjusted under 35 U.S.C. 154(b) by 796 days.

(21) Appl. No.: 12/163,552

(22) Filed: Jun. 27, 2008

(65) Prior Publication Data
US 2009/0001982 A1    Jan. 1, 2009

(30) Foreign Application Priority Data
Jun. 27, 2007  (DE) .......................... 10 2007 029 665

(51) Int. Cl.
*G01R 33/09*  (2006.01)
(52) U.S. Cl. .................................. 324/252; 324/207.21
(58) Field of Classification Search ............ 324/207.21, 324/252
See application file for complete search history.

(56) References Cited

U.S. PATENT DOCUMENTS

| | | | |
|---|---|---|---|
| 6,020,738 A | 2/2000 | Van Den Berg et al. | |
| 6,031,372 A | 2/2000 | Van Den Berg | |
| 2001/0020847 A1 | 9/2001 | Mattheis et al. | |
| 2006/0202692 A1 * | 9/2006 | Tatschl et al. | 324/252 |

FOREIGN PATENT DOCUMENTS

| | | |
|---|---|---|
| DE | 195 20 172 A1 | 12/1996 |
| DE | 195 20 178 A1 | 12/1996 |
| DE | 197 39 550 C1 | 11/1998 |
| DE | 198 30 344 A1 | 1/2000 |
| DE | 10 2004 032 483 A1 | 1/2006 |

* cited by examiner

*Primary Examiner* — Bot Ledynh
(74) *Attorney, Agent, or Firm* — Slater & Matsil, L.L.P.

(57) ABSTRACT

A method of magnetizing a permanently magnetizable element associated with a magnetic field sensor structure includes generating a test magnetic field penetrating the magnetic field sensor structure and the permanently magnetizable element, detecting the magnetic field and providing a test signal based on a magnetic field through the magnetic field sensor structure, aligning the test magnetic field and the magnetic field sensor structure with the permanently magnetizable element to each other, until the test signal reaches a set value corresponding to a predetermined magnetized field distribution with respect to the magnetic field sensor structure, and generating a magnetizing field for permanently magnetizing the element to be permanently magnetized, wherein the magnetizing field corresponds to the predetermined magnetic field distribution within a tolerance range.

37 Claims, 8 Drawing Sheets

_US 8,063,632 B2_

METHOD AND APPARATUS FOR DEFINED MAGNETIZING OF PERMANENTLY MAGNETIZABLE ELEMENTS AND MAGNETORESISTIVE SENSOR STRUCTURES

This application claims priority to German Patent Application 10 2007 029 665.9, which was filed Jun. 27, 2007 and is incorporated herein by reference.

BACKGROUND

The present invention relates to a method and an apparatus for magnetizing a permanently magnetizable element associated with a magnetic field sensor structure, for monitoring the alignment of a magnetic field, to an arrangement of a magnetic field sensor element with a permanently associated, non-magnetized hard magnetic material structure, as well as to a method of inscribing a magnetization into a magnetoresistive sensor structure and for protecting a sensor structure against external magnetic fields.

Magnetic field sensors are used, for example, for incremental velocity measurement or as angle sensors. Therefore, frequently magnetoresistive (MR) or giant magnetoresistive (GMR) sensor chips are used, which can detect a change of an external magnetic field. This external magnetic field can be generated, for example, in angle sensors, by a so-called magnetic field, which is mounted above the sensor chip on a shaft/axis. Rotating metal wheels or perforated discs are frequently used for generating a required magnetic field deflection when using magnetic field sensors for velocity measurement. In this case, a back-bias magnet, which is generally behind the magnetic field sensor, generates the magnetic field to be deflected.

In any case, the exact positioning of the magnet generating the external magnetic field, such as the back-bias magnet or the magnetic pill, and the exact direction of magnetization in relation to the magnetic field sensor structure, such as the MR/GMR sensor chip in the above-mentioned example, are of significant importance for an exact mode of operation.

SUMMARY OF THE INVENTION

According to embodiments, the present invention provides a method and an apparatus for magnetizing a permanent magnetizable element associated with a magnetic field sensor structure by generating a test magnetic field, which penetrates the magnetic field sensor structure and the permanently magnetizable element, by detecting the test magnetic field and providing a test signal based on the test magnetic field by the magnetic field sensor structure, for aligning the test magnetic field and the magnetic field sensor structure with a permanently magnetizable element to each other, until the test signal reaches a set value corresponding to a predetermined magnetic field distribution with respect to the magnetic field sensor structure, and for generating a magnetizing field for permanently magnetizing the permanently magnetizable element, wherein the magnetizing field corresponds to the predetermined test magnetic field within a tolerance range.

According to further embodiments, the present invention provides a method and an apparatus for inscribing a defined magnetization into a magnetoresistive sensor structure, an arrangement of a magnetic field sensor element with a permanently associated, non-magnetized hard magnetic material structure, a method and an apparatus for protecting the magnetization of a magnetoresistive sensor structure against an external magnetic field, as well as a method of monitoring the alignment of a reference magnetic field in relation to a magnetic field sensor structure.

BRIEF DESCRIPTION OF THE DRAWINGS

Embodiments of the present invention will be detailed subsequently referring to the accompanying drawings, in which.

DETAILED DESCRIPTION OF ILLUSTRATIVE EMBODIMENTS

With reference to FIGS. 1 to 8, embodiments of the method and apparatus for magnetizing a permanently magnetizable element associated with a magnetic field sensor structure, for monitoring the alignment of a magnetic field as well as for inscribing a magnetization into magnetoresistive sensor structure and for protecting a sensor structure against external magnetic fields will be discussed in detail below.

With regard to the following description of the embodiments of the present invention it should be noted that for simplification, the same reference numbers are used throughout the description for functionally identical and analog or equivalent elements, respectively.

Figure 1:
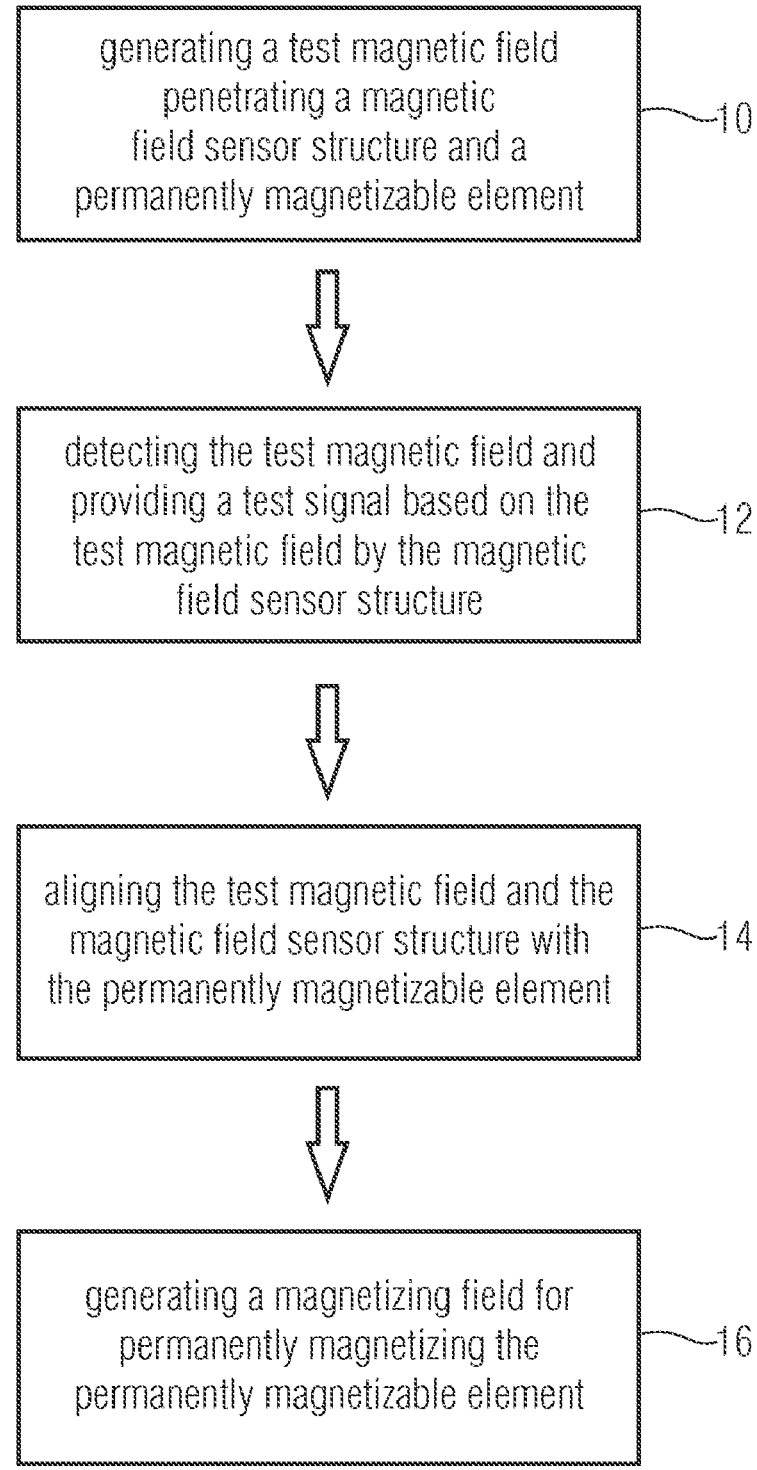
FIG. 1 is a flow diagram for the method of magnetizing a permanently magnetizable element associated with a magnetic field sensor structure.

With reference to FIG. 1, the method of magnetizing a permanently magnetizable element associated with a magnetic field sensor structure will be discussed in detail. In the context of this invention, "associated" can also mean "permanently connected" or also "arranged in a spaced way". The permanently magnetizable element can be a hard magnetic material having a high coercive field strength and thus having high resistance against external magnetic fields. Such hard magnetic materials can be magnetized permanently as permanent magnets by the impact of a sufficiently strong magnetic field. A permanent magnet is a piece of magnetizable material, such as iron, cobalt or nickel, which maintains its static magnetic field without having to supply energy constantly, such as in contrast to electromagnets.

The method comprises (step 10) generating a test magnetic field penetrating the magnetic field sensor structure and the permanently magnetizable element, detecting (step 12) the test magnetic field and providing a test signal based on the test magnetic field by the magnetic field sensor structure, aligning (step 14) the test magnetic field and the magnetic field sensor structure with the permanently magnetizable element, until the test signal reaches a set value corresponding to a predetermined magnetic field distribution with respect to the magnetic field sensor structure, and generating (step 16) a magnetizing field for permanently magnetizing the permanently magnetizable element, the magnetizing field corresponding to the predetermined magnetic field distribution within a tolerance range.

Generating (step 10) a test magnetic field penetrating the magnetic field sensor structure and the permanently magnetizable element can, for example, be achieved by electrical excitation of a coil arrangement having one or several current-carrying air or conductor coils, respectively, and having the magnetic field sensor structure and the permanently magnetizable element positioned in its magnetic field.

Detecting (step 12) the test magnetic field and providing a test signal based on the test magnetic field by the magnetic field sensor structure can, for example, be performed with magnetoresistive sensors, such as tunnel magnetoresistance (TMR), anisotropic magnetoresistance (AMR) or giant magnetoresistance (GMR) sensor structures. The usage of other magnetic field sensor structures, such as Hall probes, colossal magnetoresistance (CMR) sensors, magnetic resistors, magnetotransistors, giant planar Hall effect sensors, spin transistors, giant magnetic impedance (GMI) elements or magnetic field diodes is also possible. However, it should be noted that the above list is not exhaustive and thus represents no limitation with regard to the invention.

The magnetic field sensor can have, for example, a test output, via which the test signal based on the test magnetic field can be read out. Further, magnetic field auxiliary sensor structures can be placed on the magnetic field sensor structure, whose measurement values are only read out during the inventive method. Further magnetoresistive sensor structures that can, for example, measure the magnetic field component orthogonal to the normal measurement field direction in the magnetic field sensor structure plane, and/or, for example, Hall sensors that can detect the magnetic field component perpendicular to the magnetic field sensor structure plane, can be arranged as magnetic field auxiliary sensor structures.

Hall sensors have, for example, the advantage that they, due to the non-existing saturation, provide a signal from which in any case a gradient can be established for determining the optimum position for aligning the magnetic field and the magnetic field sensor structure with the permanently magnetizable element.

The magnetic field sensor structure can also have two or more sensor elements, which are then used for detecting the test magnetic field and also for providing the test signal based on the test magnetic field. The magnetic field sensor structure can have, for example, a test mode in which measurement values of the difference in voltage of the sensor elements forming a bridge circuit or also a voltage of individual sensor elements, such as the voltage of the right and left so-called half bridges, can be read out individually.

Aligning (step 14) the test magnetic field and the magnetic field sensor structure with the permanently magnetizable element to each other can be performed in different ways. The magnetic field sensor structure and the associated permanently magnetizable element can, for example, be aligned with respect to an existing test magnetic field. For example, the magnetic field sensor structure with the associated permanently magnetizable element can be moved in a fixedly positioned coil arrangement consisting of one or several current-carrying air/conductor coils for generating the test field in such a way in the magnetic field of the coil arrangement that the test signal reaches a certain set value corresponding to a predetermined magnetic field distribution with respect to the magnetic field sensor structure. By changing the alignment of the magnetic field sensor structure in the test magnetic field, a change of the test signal can be achieved, and thus the spatial positioning of the magnetic field sensor structure with the associated permanently magnetizable element up to a predetermined set value can be achieved. After reaching the set value and thus the spatial positioning of the magnetic field sensor structure with the associated permanently magnetizable element in the test magnetic field, the magnetizing field for permanently magnetizing the permanently magnetizable element can be generated. Thereby, the magnetizing field can correspond to the predetermined magnetic field distribution of the test magnetic field within a tolerance range. The tolerance range or the possible deviation between the magnetizing field and the test magnetic field, respectively, can, for example, be less than 20%, 10%, 5% or 3% and should be as low as possible. So that the magnetic field and the test magnetic field have an appropriate field distribution, they can both be generated by the same coil arrangement with one or several current-carrying air/conductor coils. The magnetizing field can be large enough to magnetize the permanently magnetizable material deeply into the saturation to generate a permanently magnetized element. When turning off the magnetizing field, the permanently magnetizable element has a permanent magnetic field in the size of the so-called remanence. Thus, the permanently magnetizable element can represent a future permanent magnet. The magnetization can be performed by pulse-like application of a high magnetizing field with the help of an electromagnet. The test magnetic field can have a magnetic field strength smaller than the magnetizing field strength required to permanently magnetize the permanently magnetizable material. The test magnetic field can be applied across a longer time period since the same performs the positioning of the magnetic field sensor structure with the arranged permanently magnetizable element. The test magnetic field can, for example, be in the order of magnitude of the back-bias magnet required for the functioning of the magnetic field sensor structure for incremental velocity measurement, or also in the order of magnitude of the magnetic field of a magnetic pill required for the functioning of a rotation angle sensor.

The magnetic field sensor structure with the arranged permanently magnetizable element can, for example, be a magnetoresistive sensor, which is firmly connected to the back-bias magnet for a magnetic field sensor for incremental velocity measurement. When using magnetic field sensors for incremental velocity measurement, rotating metal wheels or perforated discs are frequently used for generating the required magnetic field deflection. A back-bias magnet, which is normally behind the magnetic field sensor, generates the magnetic fields to be deflected. As has already been noted above, the positioning accuracy of the magnet can cause sensitivity variations, for example, between the sensor elements of a differential measurement arrangement on the magnetic field sensor structure, and an offset in the velocity measurement. Further, inaccuracies in the positioning of the system of a back-bias magnet and magnetic field sensor in front of the gear are added to this. In magnetoresistive sensors, mispositioning can have the effect that magnetic field changes through the gear are detected in such a different way at different positions on the magnetic field sensor structure with regard to offset, sensitivity, phase position and saturation effects that a differential measurement can no longer be interpreted in a meaningful way. Thus, exact positioning of the magnetic field sensor structure with respect to the back-bias magnet generally lying behind the sensor structure is desired. Therefore, a permanently magnetizable element can be mounted in a chip housing together with the magnetic field sensor structure. The alignment of the magnetic field sensor structure in fixed connection with the future magnet in the magnetizing field can then be made such that the magnetic field sensor structure is operated in a weaker test magnetic field, which is also generated by the magnetizing means, and the magnetic field sensor structure uses output signals for optimizing the position prior to generating the strong magnetizing field. As has already been described above, for improving the positioning accuracy, the magnetic field sensor structure can also have a test output, via which the field strength measurement values of the magnetic field sensor structure can be read out if the output normally only provides switching signals. By introducing magnetic field auxiliary sensor structures, the alignment of the magnetic field sensor structure in fixed connection to the future magnet can be optimized in the test and magnetizing field.

Then, the permanently magnetizable element, for example the back-bias magnet, still to be magnetized can then be integrated into a chip housing or integrated circuit (IC), respectively, together with the magnetic field sensor structure. The magnetization of the permanently magnetizable element or the back-bias magnet, respectively, can then be performed after a functional test of the respective chip functionality. This has the advantage that the tests, for example, so-called back end tests, can be performed at non-magnetic devices and thus with standard test and process equipment. Possible placing tolerances in the integration into the chip housing can then be compensated by the above-described method. Magnetization of the back-bias magnet can then be performed, for example, only after the overall module or assembly setup with the respective magnetic field sensor chip.

An arrangement of a magnetic field sensor and a non-magnetized hard magnetic material can thus be arranged in a common package or component, respectively. Thereby, the hard magnetic material can be determined to be subsequently magnetized to a permanent magnet after it is firmly fixed to the magnetic field sensor, wherein its magnetization for generating the back-bias magnetization can be individually aligned in relation to the magnetic field sensor.

Figure 2A:
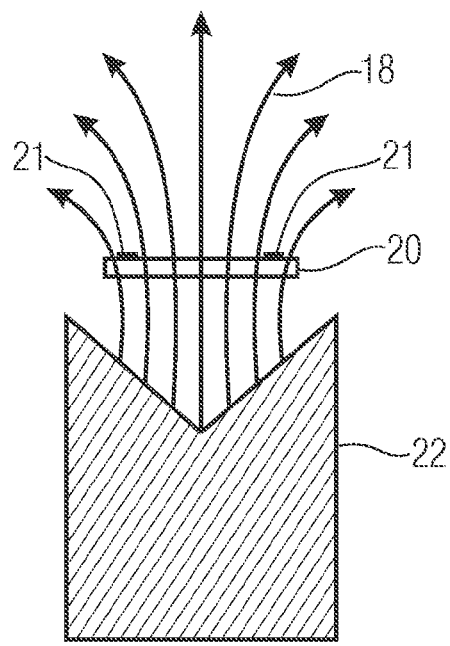
FIGS. 2a and 2b are a schematic cross-sections of a magnetic field sensor structure with the magnetic field lines of a back-bias magnet.
Figure 2B:
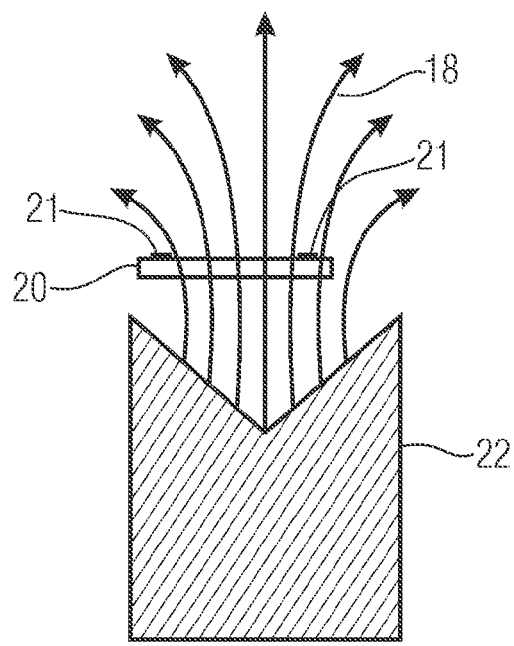

For carrying out the adjustment of the magnetizing field for the back-bias magnet, a test magnetic field in the order of magnitude of the field that the back-bias magnet should have after the magnetization can be generated, for example, with the magnetizing coil arrangement. With this test magnetic field, different variations can be performed, which allow to determine the required variation of magnetization of the back-bias magnet for the best possible compensation of placing and arrangement tolerances. FIGS. 2a/2b show schematically the back-bias magnet 22, its field distribution 18 and the magnetic field sensor structure 20, which can, for example, be a magnetoresistive sensor structure, where the magnetic detection plane corresponds to the sensor structure plane. As shown in FIGS. 2a/2b, the magnetic field sensor structure 20 can have, for example, two sensor elements 21, which would detect a different magnetic field strength at a mispositioning of the magnetic field sensor structure 20 in relation to a back-bias magnet 22 with its constant magnetic field line distribution 18, which can cause inaccuracies, for example, in a differential measurement.

Figure 3A:
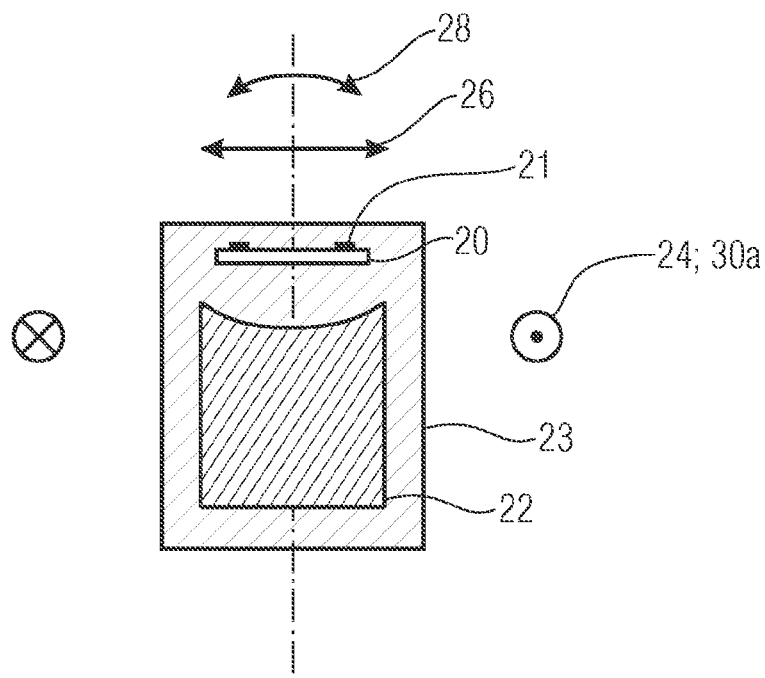
FIG. 3a is a schematic cross-sectional image of an apparatus for magnetizing a permanently magnetizable element associated with a magnetic field sensor structure.
Figure 3B:
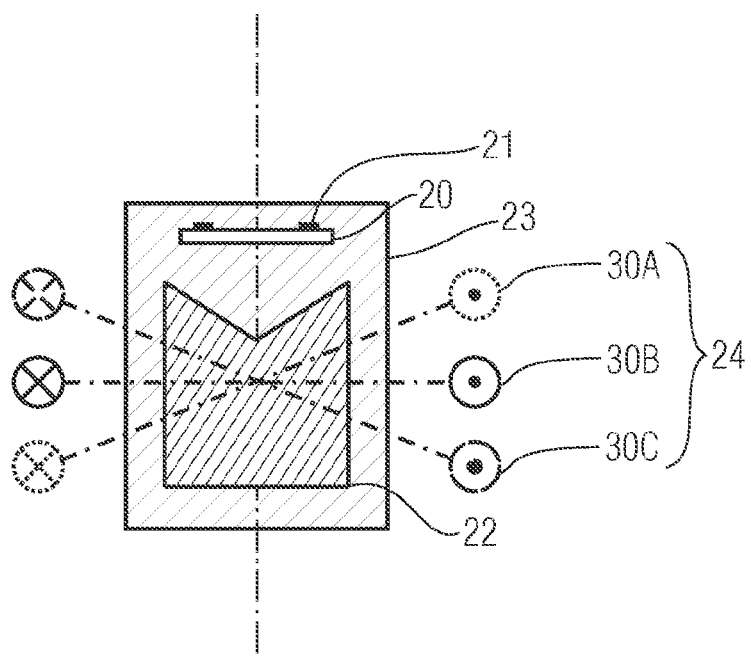
FIG. 3b is a schematic cross-sectional image of another embodiment of an apparatus for magnetizing the permanently magnetizable element associated with a magnetic field sensor structure.
Figure 3C:
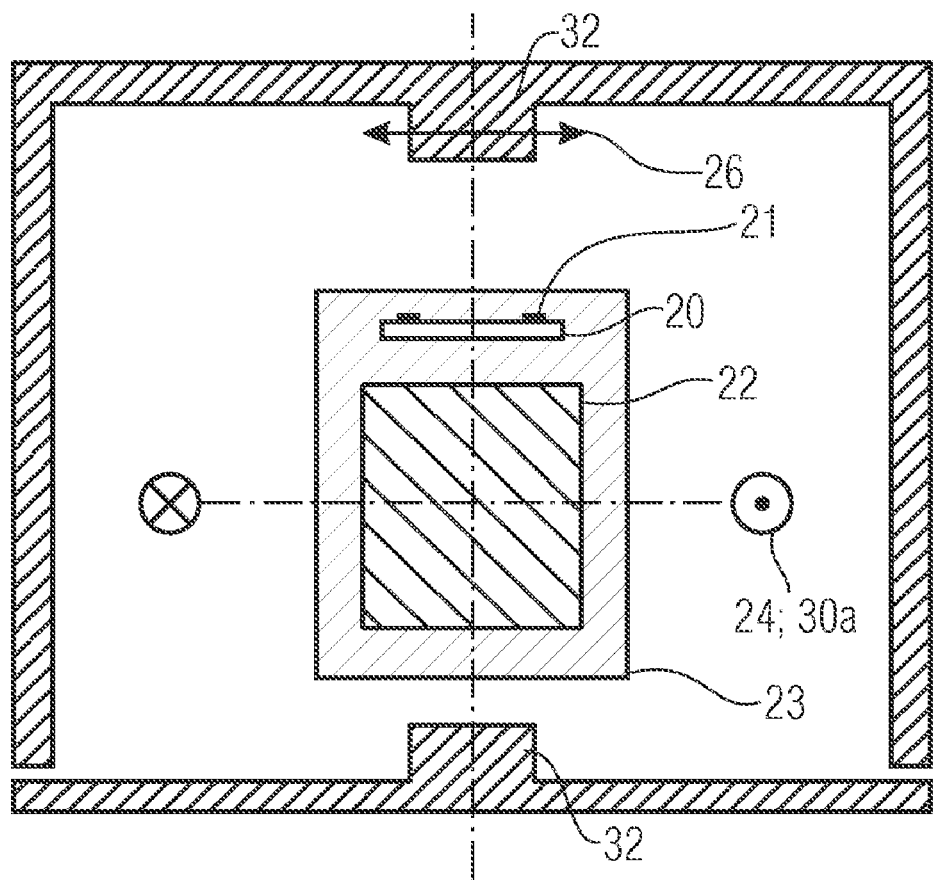
FIG. 3c is a schematic cross-sectional image of a further embodiment of an apparatus for magnetizing a permanently magnetizable element associated with a magnetic field sensor structure.

As can be seen in FIGS. 3a-c, the permanently magnetizable element, in this case the back-bias magnet 22, can have a different shape adapted to the respective requirement for generating the permanent magnetic field.

The set value corresponding to a predetermined magnetic field distribution with respect to the magnetic field sensor structure can be chosen, for example, such that the field distribution of the test magnetic field, and thus the magnetizing field, and thus the magnetic field of the permanently magnetized element, is perpendicular to the magnetic detection plane within a tolerance range. Again, the tolerance range can, for example, be less than 20%, 10%, 5% or 3%.

FIGS. 3a-c show schematically the means for aligning the test magnetic field and the magnetic field sensor structure with the permanently magnetizable element to each other. The means can have, for example, a coil arrangement 24 consisting of one or several air/conductor coils 30a-30c implemented as electromagnets, i.e., when the coil arrangement carries a current, a magnetic field is generated within the coil arrangement. Further, FIG. 3a shows schematically that the component 23 wherein the magnetic field sensor structure 20 is integrated in fixed connection to the permanently magnetizable element and the future back-bias magnet 22, respectively, can be moved within a magnetic field not shown in the figure by a horizontal movement 26 or also a tilting movement 28. Aligning the component 23 in the test magnetic field generated by the coil arrangement 24 is performed until the test signal corresponds to a set value, which then corresponds to a predetermined magnetic field distribution in the magnetic field sensor structure. Aligning the test magnetic field generated by the coil arrangement 24 and the magnetic field sensor structure 20 with the permanently magnetizable element 22 can also be performed such that the coil arrangement consists of several air/conductor coils 30a-30c which can generate a variable test and later magnetizing field. The variation of the target frequency can be performed until the test signal corresponds to the desired set value.

The terminals for the output of the test signals of the magnetic field sensor structure 20 are not illustrated in the schematical figures.

FIG. 3c shows a further embodiment in a schematic image. Apart from the coil arrangement 24 and the component 23 with the magnetic field sensor structure 20 and the permanently magnetizable element 22, a spatially positionable soft magnetic element 32 can be in the magnetic field of the coil arrangement 24. By a movement of the soft magnetic element 32 serving as a core for focusing the magnetic field lines of the coil arrangement 24, the magnetic field of the coil arrangement 24, for example, the test magnetic field, can be altered such that the test signal of the magnetic field sensor structure 20 corresponds to the set value. In this position, the stronger magnetizing field can be generated by the coil arrangement 24 to permanently magnetize the permanently magnetizable element.

During the alignment of the test magnetic field and the magnetic field sensor structure to each other, the magnetic field sensor structure can be simultaneously be tested for its functionality, since the magnetic field sensor structure should provide respective test signals. This means, test time can possibly be saved in the further production process.

The above-described method can, for example, also be used for magnetizing a so-called magnetic pill in a rotation angle sensor with a MR/GMR sensor structure. Such a rotation angle sensor with a MR/GMR sensor structure is illustrated schematically in FIG. 7 as embodiment of the invention. A so-called magnetic pill 42 is arranged at the end of a pivot-mounted axis 36 and is non-magnetized at first. A MR/GMR sensor structure is arranged at a distance of, for example, 0.5 mm to 5 mm below the magnetic pill, wherein the detection plane of the sensor structure is perpendicular to the rotation axis of the magnetic pill. The MR/GMR sensor structure with a Hall probe as magnetic field auxiliary sensor structure is realized in a silicon chip 44. The silicon chip 44 is mounted in a housing 60 with chip pins 68. The sensor chip can, for example, be adhered or soldered to a printed circuit board 50, which is again mounted in an appropriate way via mounting posts 52 of a printed circuit board 50 to a housing part or frame 34, which at the same time comprises the ball bearing 38 for the rotation axis 36. The magnetic pill, which is non-magnetized at first, is only magnetized after all parts of the system, at least the rotation axis 36 including bearing 38, the magnetic pill 42 of the sensor chip and its terminals are mounted and possibly molded. For magnetizing the magnetic pill in the rotation angle sensor, the above-described method of magnetizing a permanently magnetizable element, here the magnetic pill, can also be performed. There, the test magnetic field in the magnetizing field have the magnetic field distribution predetermined by the set value within a tolerance range.

For permanently magnetizing the magnetic pill, the permanently magnetizing material of the magnetic pill is saturated by a strong external magnetizing field generated by the magnetizing coils 40. Normally, the magnetic field is generated by an air/conductor coil, consisting of a few thick copper turns, by sending a short strong current pulse through the coil. There, the field has to be about three to five times larger than the coercivity of the permanently magnetizable element. Depending on the used permanently magnetizable material, the currents in the copper turns of the coil arrangement can be 250 kA/m for AlNiCo up to 5 MA/m for NdDyFeB. For generating such large magnetic fields, the coil arrangement can be operated in a pulsed way. The pulses can be very short, since otherwise the power dissipation transformed in the coil arrangement can cause fusing of the same or can cause a softening, and this can result in a form change due to the powers.

Figure 7:
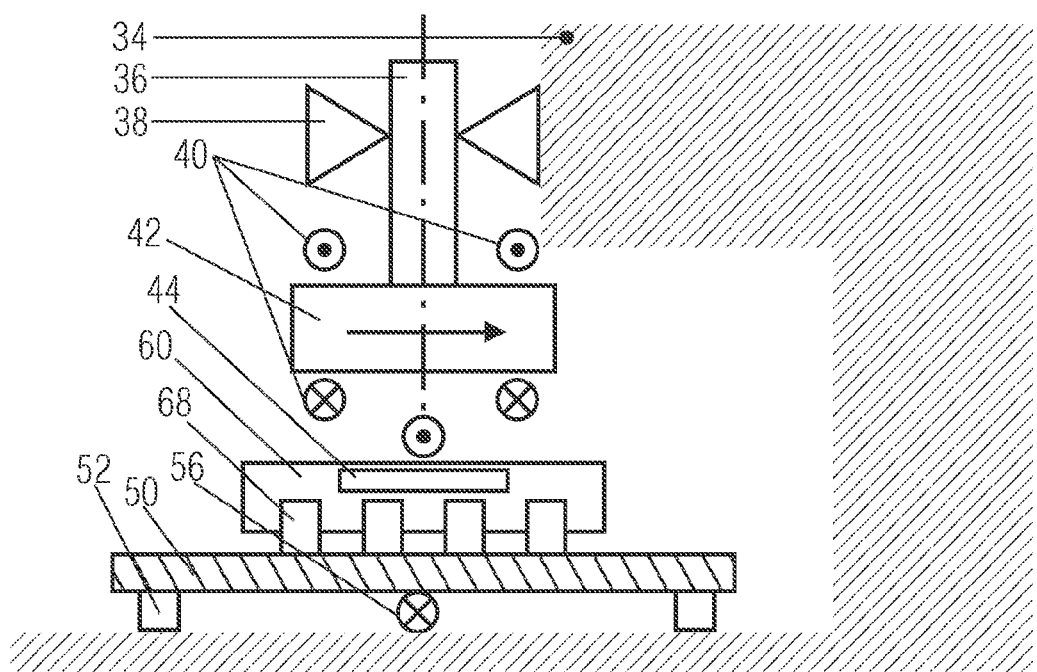
FIG. 7 is a schematic cross-sectional image of a rotation angle sensor having a magnetic field sensor chip and associated therewith a pivot-mounted magnetic pill.

In angular sensors, as they are exemplarily described in FIG. 7, MR/GMR sensor chips are frequently used, which detect the direction of the magnetic field generated by a magnetic pill 42, which is again mounted on a shaft/axis 36. If, however, the direction of the magnetization of the magnetic pill is not perfectly parallel to the MR/GMR sensor chip detection plane, an angle error occurs. Reason for this non-parallelity are various position tolerances. The magnetization of the magnetic pill might not be perfect to the surface of the pill, the pill might not be mounted perfectly perpendicular to the rotation direction, since, for example, the adhesive holding the magnetic pill from the rotation axis has no uniform thickness or the MR/GMR sensor chip has not been soldered on the mount in a perfectly perpendicular way to the rotation direction of the magnetic pill, or, since, for example, its pins float unevenly on the soldering tin, the sensor chip housing has a slightly wedge-shaped geometry, and the adhesion of the chip on the chip carrier frame has a wedge-shaped form. Even the silicon, in which the magnetic field sensor structure is realized, might not be polished in a perfectly planar way, or the magnetization of the MR/GMR sensor chip is not perfectly parallel to the silicon surface since the inscription process of the magnetization is prone to tolerances. These arrangement errors can be reduced by the above-described inventive methods, so that the accuracy, for example, of angular measurement, can be increased.

Figure 4:
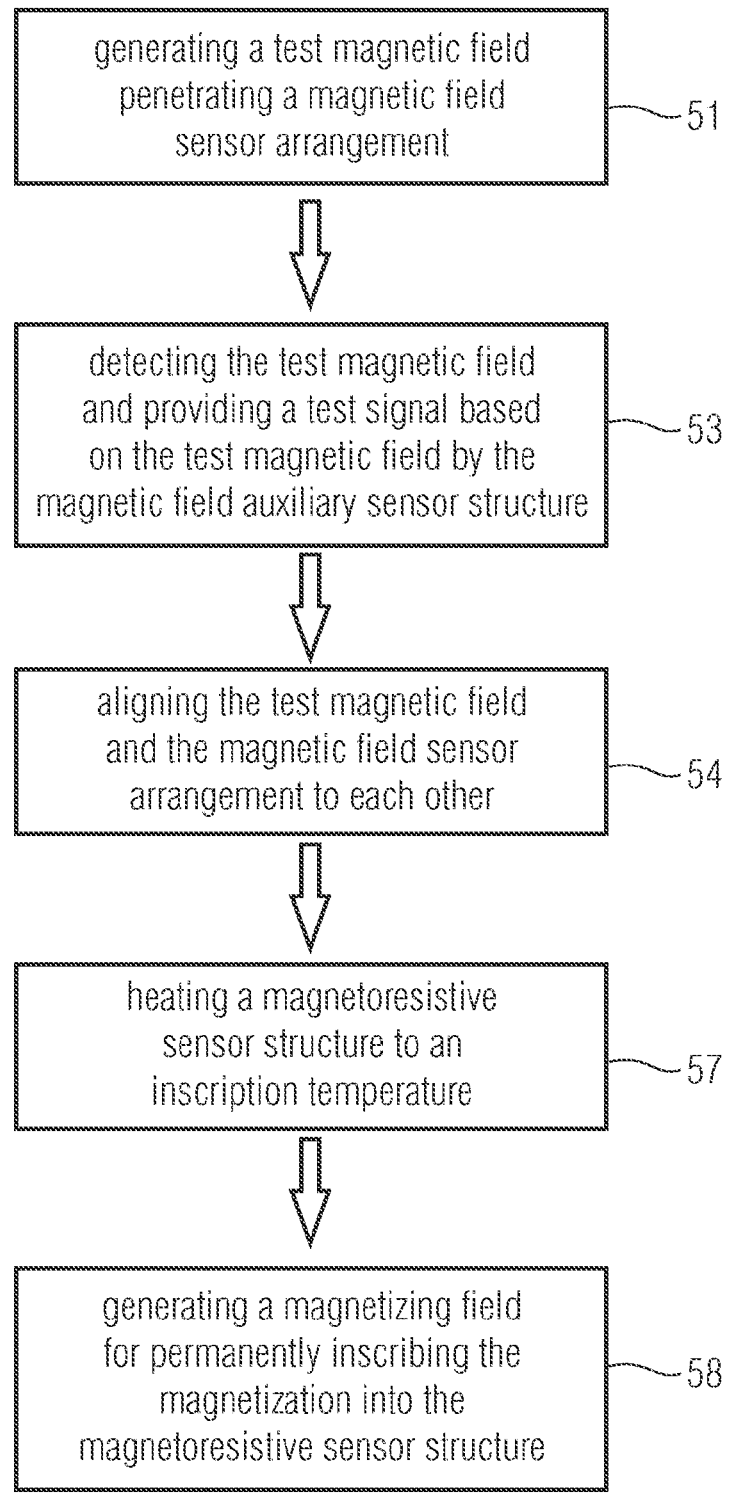
FIG. 4 is a flow diagram of the method of inscribing a defined magnetization into a magnetoresistive sensor structure of a magnetic field sensor arrangement.

With reference to FIG. 4, the method of inscribing a defined magnetization into a magnetoresistive sensor structure of a magnetic field sensor arrangement further having a magnetic field auxiliary sensor structure, is illustrated in a flow diagram. The method includes (step 51) generating a test magnetic field penetrating the magnetic field sensor arrangement, further detecting the test magnetic field and providing the test signal (step 53) based on the test magnetic field by the magnetic field auxiliary sensor structure, further aligning (step 54) the test magnetic field and the magnetic field sensor arrangement to each other until the test signal reaches a set value corresponding to a predetermined magnetic field distribution in the detection plane of the magnetic field auxiliary sensor structure. Additionally, the method includes heating (step 57) of the magnetoresistive sensor structure to an inscription temperature and generating a magnetic field (step 58) for permanently inscribing the magnetization into the magnetoresistive sensor structure, wherein the magnetizing field has a predetermined corresponding magnetic field distribution within a tolerance range.

The magnetoresistive sensor structure can be, for example, an anisotropic magnetoresistance (AMR), a giant magnetoresistance (GMR) or a tunnel magnetoresistance (TMR) sensor structure.

Generating a test magnetic field can again be performed by a coil arrangement with one or several current-carrying conductor coils. Detecting the test magnetic field and providing a test signal (step 53) based on a test magnetic field is performed by the magnetic field auxiliary sensor structure that can, for example, be arranged below the magnetoresistive sensor structure. The magnetic field auxiliary sensor structure can, for example, be a Hall probe, which can then be arranged such that the magnetic detection plane of the Hall probe is perpendicular to the magnetoresistive sensor structure to be magnetized.

Aligning (step 54) the test magnetic field and the magnetic field sensor arrangement to each other can be performed such that the coil arrangement generating the test magnetic field is adjusted such that the test signal of the magnetic field auxiliary sensor structure assumes a certain set value corresponding to a certain magnetic field distribution in the detection plane of the magnetic field auxiliary sensor structure. Since the magnetic detection plane of the magnetic field auxiliary sensor structure and the magnetic detection plane have a fixed angular dependence, a certain alignment of the test magnetic field to the magnetic detection level of the magnetoresistive sensor structure can be obtained. The magnetic detection plane of the magnetic field auxiliary sensor structure, for example, a Hall sensor, can stand perpendicular on the magnetoresistive sensor structure, and the set value can be defined such that the test magnetic field stands perpendicular to the magnetic detection plane of the magnetic field auxiliary sensor structure and thus, the test magnetic field is aligned in parallel to the magnetoresistive sensor structure chip area.

After aligning the test magnetic field and the magnetic field arrangement to each other, such that the test signal corresponds to the set value, the magnetoresistive sensor structure can be heated to an inscription temperature (step 57). The exact inscription temperature depends on the used materials of the magnetoresistive sensor structure. The inscription temperature can, for example, be higher than 200° C. and can be approximately 250° C. Generating a magnetizing field (step 58) for permanently inscribing the magnetization into the magnetoresistive sensor structure can then again be performed by a coil arrangement having one or several current-carrying air coils. Thus, the coil arrangement for generating the magnetic test field and for generating the magnetizing field can be identical. Inscribing a defined magnetization into the magnetoresistive sensor structure can only be performed at a corresponding heating of the sensor structure. Heating can be performed in an oven designed for this process, or, for example, by locally heating the magnetoresistive sensor structure with a laser. It is also possible to perform detecting the test magnetic field and providing the test signal based on the test magnetic field by the magnetic field auxiliary sensor structure, such as a Hall sensor, and aligning the test magnetic field and the magnetic field sensor arrangement to each other during heating the magnetoresistive sensor structure or also at the respective inscription temperature. Alternatively, it is also possible to operate the Hall sensor even at, for example, 250° C., since the same is relatively robust against high temperatures. In local heating during the inscription process, a layout and circuit design should be chosen that can buffer a high temperature gradient. It is possible that in simple systems for determining the position of the magnetoresistive sensor structure with respect to the magnetic field direction of the test magnetic field, a magnetic alternating field is applied, because then the offset resulting in a Hall probe can be neglected, which simplifies the circuit technology.

It is also possible to use the above-described method of inscribing a defined magnetization for a wafer comprising a plurality of magnetic field sensor arrangements, and thus a plurality of magnetic field sensor arrangements can be magnetized simultaneously in a defined way.

In order to determine in the above-described method whether the angular position is sufficiently exact during the alignment of the test and magnetizing field, the magnitude of the magnetic field strength in the plane of the magnetoresistive sensor structure should be known. This can be obtained by calibrating the magnetic system for inscribing. Inaccuracies of several percent can be tolerated. Additionally, the magnetic sensitivity of the Hall probe should be given. With known self-compensation methods, the measurement inaccuracy in Hall probes can be reduced to several percent. Additionally, it should be considered that the Hall probe output signal remains below a predetermined limit in order to guarantee the direction of the magnetic field sufficiently near in the magnetoresistive sensor structure surface.

The magnetic system generating the test and magnetizing field can, for example, be rotated in the range of several angular degrees around the intended ideal position for inscribing the defined magnetization into the magnetoresistive sensor structure, and several test signals of the magnetic field auxiliary sensor structure can be accepted. From that, a curve can be extracted, which passes through a zero line, wherein the zero crossing represents an ideal angular position of the magnetic system, which can then be calculated, and can be introduced into the magnetoresistive sensor structure for inscribing defined magnetization. Possibly, it can be advantageous to operate without alternating the magnetic field and with the so-called spinning current method, since then the lateral Hall effect is averaged out, and thus the accuracy of the angular adjustment of the magnetic system can be increased. Normally, the Hall probe has an offset that can be spurious in the measurement of a magnetic field. The Hall probe can be operated in the known spinning current method to separate the offset from the field portion. Also, an operation is possible where the Hall probe determines its offset in a calibration phase, in order to be able to measure the field with a bandwidth as high as possible in a subsequent measurement phase, without time-discrete signal processing.

Since the magnetization in the magnetoresistive sensor structure aligns itself with respect to the applied magnetic field at the respective inscription temperature and is "eternalized" there, when this magnetic field is not exactly parallel to the magnetoresistive sensor structure surface due to mounting tolerances, this angular error can be transferred to the magnetoresistive sensor structure and remains as an inaccuracy factor during further usage of the magnetoresistive sensor structure. Thus, it can be advantageous when it is tested with an integrated magnetic field auxiliary sensor structure in the magnetic inscription process into the magnetoresistive sensor structure, as described above, whether the applied test or magnetizing field, respectively, stands sufficiently well, e.g., perpendicular on the magnetic field auxiliary sensor structure.

Figure 5:
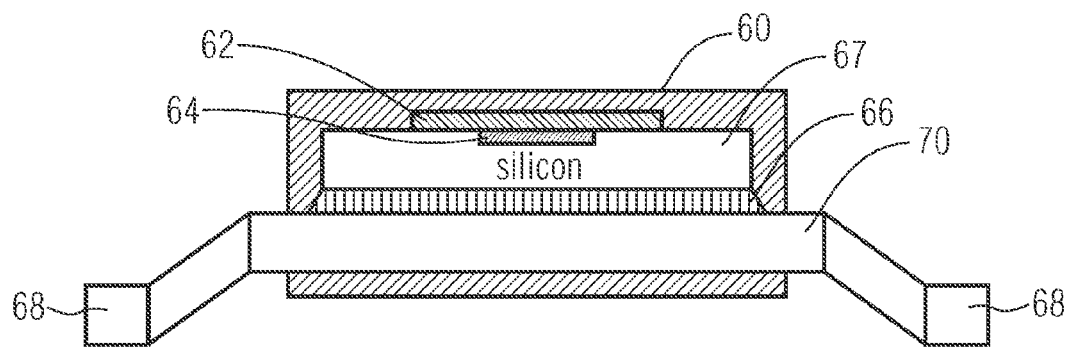
FIG. 5 is a schematic side view of a magnetic field sensor chip arranged in a housing.

FIG. 5 shows exemplarily a schematic cross-section of a magnetic field sensor arrangement 67 consisting of a silicon chip having a Hall probe 64 and an MR/GMR sensor structure 62 above the same. The magnetic field sensor arrangement 67 is connected on a chip frame carrier or lead frame, respectively, 70 with an adhesive or die attach film 66, respectively. In the side view, the chip carrier frame 70 has chip pins on both sides for further electrical contacting 68. The magnetic field sensor arrangement 67 is arranged in a housing 60. In the side view of the magnetic field sensor arrangement in a sensor chip illustrated in FIG. 5, the magnetoresistive layer for detecting the direction of magnetic fields is in the plane of the MR/GMR sensor structure, which means parallel to the sensor chip surface. In FIG. 5, a conventional Hall probe 64 for detecting magnetic fields perpendicular to the sensor chip surface is immediately below, which means in FIG. 5 in a vertical direction to the sensor chip surface.

For magnetoresistive sensor structures, a strong magnetizing field, such as it is required in magnetizing a permanently magnetizable element, can be damaging, since it can affect the magnetization of the magnetoresistive sensor structure layer. New MR/GMR sensor structures can withstand much higher fields at room temperature as they are used for inscribing at an inscription temperature of, for example, 250° C., but small changes at the MR/GMR characteristic curve cannot be precluded. Particularly since it is no longer possible or economical to adjust a complete module with an MR/GMR sensor structure in a wide temperature range or recalibrate the same, respectively.

For avoiding damage of the magnetoresistive sensor structure by a too strong magnetizing field for permanent magnetization of the permanently magnetizable element, the method of protecting a sensor arrangement with a sensor chip against an external multi-magnetic field can be performed. This method cannot only be applied to magnetoresistive sensor structures but to all sensor structures or functional chips that can be damaged by an external magnetic field. The method comprises generating a secondary magnetic field opposing the external primary magnetic field at the sensor chip.

Figure 8:
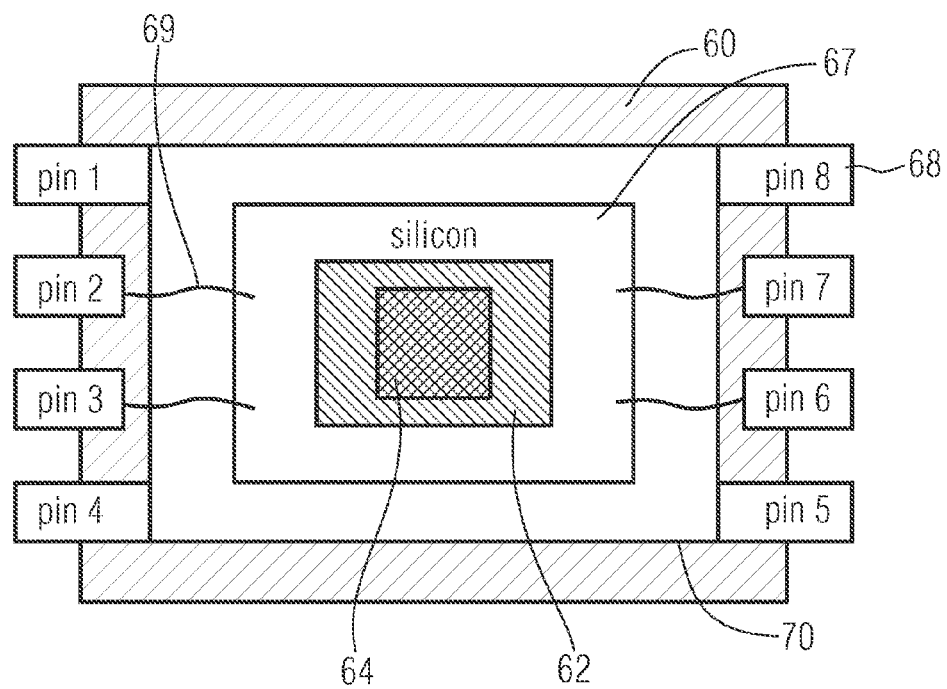
FIG. 8 is a schematic top view of a magnetic field sensor chip with chip carrier frame and chip pins.

Generating an opposing secondary magnetic field can, for example, be performed such that a compensation coil is placed around the sensor chip, which is carrying a current proportional to the external primary magnetic field, in order to generate an opposing secondary magnetic field at the sensor chip. If the external primary magnetic field is, for example, generated by a coil arrangement, both coils can be connected in series and can carry the same current when the coil arrangement for generating the magnetizing field has more turns than the compensation coil at the sensor chip, so that the magnetic field sensor chip is mainly extinguished. It is also possible to perform generating the opposing secondary magnetic field at the sensor chip such that a current flows through the chip carrier frame shown in FIG. 8 which generates a magnetic field tangential to the sensor chip surface. FIG. 8 shows the schematical top view of the magnetic field sensor arrangement 67, for example, consisting of silicon with the MR/GMR sensor structure 62 and the underlying Hall probe 64 mounted on the chip carrier frame 70. Additionally, the sensor chip has eight chip pins (pin 1 to pin 8), wherein the pins 1, 4, 5 and 8 are formed such that they can be used to send a large current through the metallic chip carrier frame 70, which can generate a secondary magnetic field at the MR/GMR sensor chip opposing the magnetizing field, which means the primary magnetic field. Pins 2, 3, 7 and 6 are conventional pins via which the sensor chip is contacted with bond wires. It is also possible that a connection to ground of the chip is provided via a bond connection between one or several of the pins 1, 4, 5, 8. In the top view in FIG. 8 the MR/GMR sensor is only illustrated schematically as an unitary area. Normally, such MR/GMR sensors are mostly designed in a serpentine shape and are divided into several sub-units, for example, in order to be able to perform differentiation of the magnetic field components in X and Y direction in the detection plane of the magnetic field sensor.

As can be seen in FIGS. 5 and 8, the Hall probe should be positioned as close as possible to the MR/GMR sensor chip to detect the field there. Additionally, it can be space-saving when the MR/GMR sensor chip is sputtered on the chip, leaving the area below the MR/GMR sensor chip available, which can then be used for forming, for example, the above-mentioned Hall probe. In the chip carrier frame shown schematically in FIG. 8, the current for generating the secondary magnetic field can flow horizontally between pins 4 and 5 or 1 and 8, respectively, or also vertically between pins 1 and 4 or 8 and 5, respectively.

A further possibility for generating a secondary magnetic field opposing an external primary magnetic field can be realized by using a short-circuit turn around of the sensor arrangement with the sensor chip. Generating the opposing secondary magnetic field is thereby performed such that when an external primary magnetic field is applied quickly, a magnetic flow flows through the short-circuit turn, such that its flow change generates a magnetic field opposing the primary magnetic field, according to Lenz's law. This means, the MR/GMR sensor chip mounted below the pill can be protected by a short-circuit turn in the pulse-like strong applied external magnetizing field for the above-mentioned magnetic pill. This short-circuit turn can possibly already be integrated in the sensor chip, by surrounding the sensor in the chip housing at all sides with metal, for that purpose, for example, a further metal sheet fully covering and slightly overlapping the sensor can be deposited below and above the sensor. The two metallic sheets can then be connected, for example, with dense so-called via contact rows, wherein the provided metallic conductor structure can be connected to ground of the sensor chip to ensure a defined potential. Since the cross-sectional area of this flat metallic short-circuit turn is small, the magnetic flow change is also small, and thus the currents are sufficiently small so that the metallic sheets are not overloaded. In the operation of the sensor, such as the MR/GMR sensor, they do not interfere, as long as the angular measurement, for example, is performed at sufficiently small currents. It is also possible that the side edges of the upper and lower metal sheets are not short-circuited directly via via contact rows, but are connected to each other via a transistor, for example an n-metal oxide semiconductor (n-MOS) transistor. This nMOS transistor can be turned on only for magnetizing the magnetic pill and can remain switched off during normal operation in order to not reduce the bandwidth of the system by eddy currents.

The arrangement of a magnetic field sensor and a non-magnetized hard magnetic material that are arranged in a common package or component as an arrangement or module, respectively, and where the hard magnetic is still to be magnetized, can have one of the above-described apparatuses, such as a protection coil.

Figure 6:
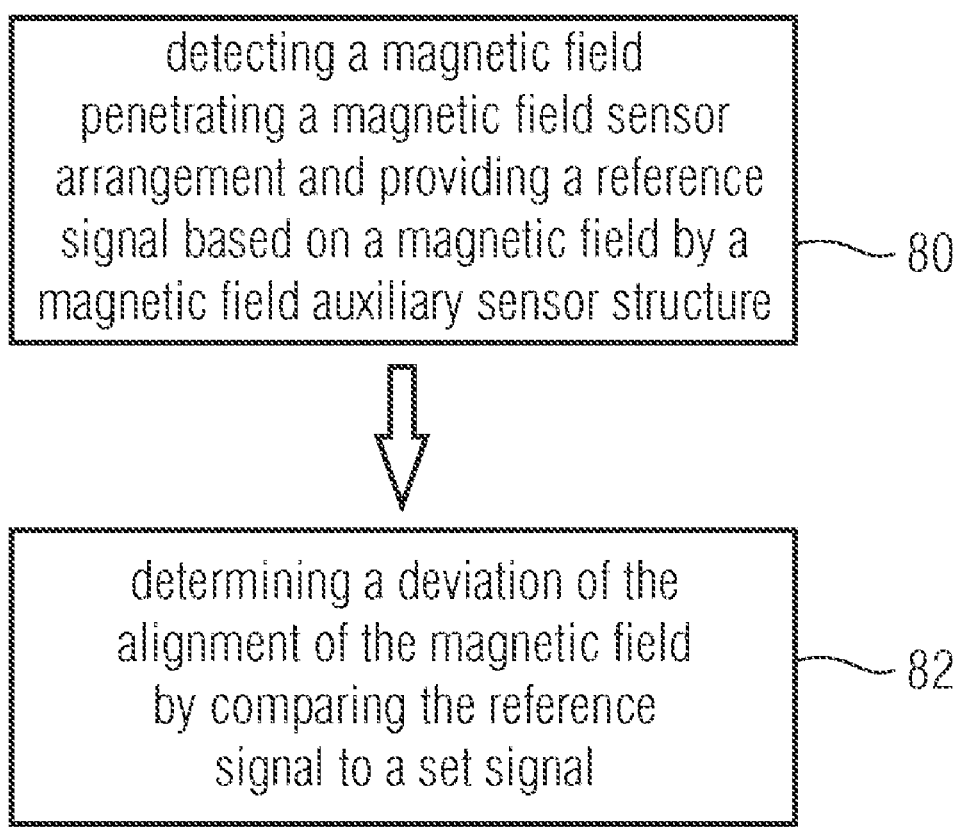
FIG. 6 is a flow diagram of the method of monitoring the alignment of a magnetic field of a reference magnet with respect to a magnetic field sensor arrangement.

FIG. 6 shows a flow diagram for the method of monitoring the alignment of a magnetic field of a reference magnet with respect to a magnetic field sensor structure arrangement. The method comprises detecting the magnetic field penetrating the magnetic field sensor arrangement, providing a reference signal (step 80) based on the magnetic field of the reference magnet by a magnetic field auxiliary sensor structure, and determining the deviation of the alignment of the magnetic field of a reference magnet in relation to the magnetic field sensor arrangement by comparing (step 82) the reference signal to a set signal corresponding to a predetermined magnetic field distribution in the detection plane of the magnetic field auxiliary sensor structure.

The magnetic field auxiliary sensor structure can be a Hall sensor and the magnetoresistive sensor structure can be the above-mentioned AMR, TMR, GMR sensor structures. In the rotation angle sensor schematically illustrated in FIG. 7, the reference signal of the magnetic field auxiliary sensor structure, in FIG. 7, for example, of a Hall sensor, can be monitored, and when a predetermined limit is exceeded, an error signal is output, because the either magnetic interference fields distort the angular measurement or an intolerable tilting of the rotation axis of the magnetic pill to the detection plane of the MR/GMR sensor structure exists. By comparing the reference signal with a set signal, an interference of the magnetic field running in the MR/GMR structure plane required for an exact mode of operation of the rotation angle sensor can be monitored.

It should be noted that the generation of a secondary magnetic field opposing an external primary magnetic field for protecting a sensor chip in a sensor arrangement is more effective the closer the coil-like arrangement for generating the secondary magnetic field can be applied to the sensor chip, without having to accept a strong feedback of the secondary coil, for example on the magnetic pill.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of magnetizing a permanently magnetizable element associated with a magnetic field sensor structure, the method comprising:
   generating a test magnetic field penetrating the magnetic field sensor structure and the permanently magnetizable element;
   detecting the test magnetic field and providing a test signal based on the test magnetic field by the magnetic field sensor structure;
   aligning the test magnetic field and the magnetic field sensor structure with the permanently magnetizable element, until the test signal reaches a set value corresponding to a predetermined magnetic field distribution with respect to the magnetic field sensor structure; and generating a magnetizing field for permanently magnetizing the permanently magnetizable element, wherein the magnetizing field corresponds, within a tolerance range, to the predetermined magnetic field distribution.

2. The method according to claim 1, wherein generating a test magnetic field is performed such that a coil arrangement, which comprises one or several conductor coils and in which the magnetic field sensor structure and the permanently magnetizable element are arranged, is electrically excited.

3. The method according to claim 2, wherein aligning the test magnetic field and the magnetic field sensor structure with the permanently magnetizable element is performed such that either the coil arrangement is aligned with the permanently magnetizable element with respect to the magnetic field sensor structure, or the magnetic field sensor structure is aligned with the permanently magnetizable element with respect to the coil arrangement.

4. The method according to claim 1, wherein the magnetic field sensor structure comprises a magnetic field main sensor structure and an associated magnetic field auxiliary sensor structure, wherein detecting the test magnetic field and providing a test signal based on the test magnetic field is performed by the magnetic field auxiliary sensor structure.

5. The method according to claim 1, wherein the magnetic field sensor structure comprises a plurality of magnetic field sensor elements, wherein detecting the test magnetic field and providing a test signal based on the test magnetic field is performed such that individual signals of the magnetic field sensor elements or a combination signal generated from the individual signals is provided as the test signal based on the test magnetic field.

6. The method according to claim 1, wherein aligning the test magnetic field and the magnetic field sensor structure with the permanently magnetizable element comprises moving a soft magnetic element in the test magnetic field.

7. The method according to claim 1, wherein the aligning is performed such that the magnetic field distribution is aligned, within a tolerance range, perpendicular to a detection plane of the magnetic field sensor structure.

8. The method according to claim 1, wherein detecting the test magnetic field and providing a test signal based on the test magnetic field is performed with a giant magnetoresistance (GMR), tunnel magnetoresistance (TMR) or anisotropic magnetoresistance (AMR) sensor structure and/or a Hall sensor element as the magnetic field sensor structure.

9. An apparatus for magnetizing a permanently magnetizable element associated with a magnetic field sensor structure, the apparatus comprising:
  means for generating a test magnetic field penetrating the magnetic field sensor structure and the permanently magnetizable element;
  means for detecting the test magnetic field and providing a test signal based on the test magnetic field by the magnetic field sensor structure;
  means for aligning the test magnetic field and the magnetic field sensor structure with the permanently magnetizable element based on the test signal, until the test signal reaches a set value corresponding to a predetermined magnetic field distribution with respect to the magnetic field sensor structure; and
  means for generating a magnetizing field for permanently magnetizing the permanently magnetizable element, wherein the magnetizing field corresponds, within a tolerance range, to the predetermined magnetic field distribution.

10. The apparatus according to claim 9, wherein the means for generating a test magnetic field and a magnetizing field comprises a coil arrangement comprising one or several air coils.

11. The apparatus according to claim 9, wherein the magnetic field sensor structure comprises a magnetoresistive sensor structure.

12. The apparatus according to claim 9, wherein the means for aligning is implemented to align the test magnetic field with the permanently magnetizable element with respect to the magnetic field sensor structure, or the magnetic field sensor structure with the permanently magnetizable element with respect to the test magnetic field.

13. The apparatus according to claim 9, wherein the means for aligning further comprises a soft magnetic element and is implemented to move the soft magnetic element in the test magnetic field.

14. The apparatus according to claim 9, wherein the magnetic field sensor structure comprises a magnetic field main sensor structure and an associated magnetic field auxiliary sensor structure, wherein the magnetic field auxiliary sensor structure is implemented to detect the test magnetic field and to provide a test signal based on the test magnetic field.

15. The apparatus according to claim 9, wherein the magnetic field sensor structure comprises a plurality of magnetic field sensor elements, wherein the magnetic field sensor elements are implemented to detect the test magnetic field and to provide a test signal, based on the test magnetic field, as individual signals of the magnetic field sensor elements or as a combination signal generated from the individual signals.

16. The apparatus according to claim 9, wherein the set value is selected such that the magnetic field distribution is aligned, within a tolerance range, perpendicular to a detection plane of the magnetic field sensor structure.

17. A method of inscribing a defined magnetization into a magnetoresistive sensor structure of a magnetic field sensor arrangement, which further comprises a magnetic field auxiliary sensor structure, the method comprising:
  generating a test magnetic field penetrating the magnetic field sensor arrangement;
  detecting the test magnetic field and providing a test signal based on the test magnetic field by the magnetic field auxiliary sensor structure;
  aligning the test magnetic field and the magnetoresistive sensor structure to each other, until the test signal reaches a set value corresponding to a predetermined magnetic field distribution in a detection plane of the magnetic field auxiliary sensor structure;
  heating the magnetoresistive sensor structure to an inscription temperature; and
  generating a magnetizing field for permanently inscribing the defined magnetization into the magnetoresistive sensor structure, wherein the magnetizing field corresponds, within a tolerance range, to the predetermined magnetic field distribution.

18. The method according to claim 17, wherein the magnetoresistive sensor structure comprises a tunnel magnetoresistance (TMR), a giant magnetoresistance (GMR) or an anisotropic magnetoresistance (AMR) sensor structure.

19. The method according to claim 17, wherein aligning the test magnetic field is performed such that the magnetic field distribution is perpendicular, within a tolerance range, to the detection plane of the magnetic field auxiliary sensor structure.

20. An apparatus for inscribing a defined magnetization into a magnetoresistive sensor structure of a magnetic field sensor arrangement, which further comprises a magnetic field auxiliary sensor structure, the apparatus comprising:
- means for generating a test magnetic field penetrating the magnetic field sensor arrangement;
- means for detecting the test magnetic field and providing a test signal based on the test magnetic field by the magnetic field auxiliary sensor structure;
- means for aligning the test magnetic field and the magnetoresistive sensor structure to each other, based on the test signal, until the test signal reaches a set value corresponding to a predetermined magnetic field distribution in a detection plane of the magnetic field auxiliary sensor structure;
- means for heating the magnetoresistive sensor structure to an inscription temperature; and
- means for generating a magnetizing field for permanently inscribing the defined magnetization into the magnetoresistive sensor structure, wherein the magnetizing field corresponds, within a tolerance range, to the predetermined magnetic field distribution.

21. The apparatus according to claim 20, wherein the magnetoresistive sensor structure comprises a tunnel magnetoresistance (TMR), a giant magnetoresistance (GMR) or an anisotropic magnetoresistance (AMR) sensor structure.

22. The apparatus according to claim 20, wherein the set value is selected such that the magnetic field distribution is aligned, within a tolerance range, perpendicular to the detection plane of the magnetic field auxiliary sensor structure.

23. The method according to claim 1, comprising:
- monitoring the alignment of a magnetic field of a reference magnet with respect to a magnetic field sensor structure comprising a magnetic field main sensor structure and an associated magnetic field auxiliary sensor structure, the monitoring comprising:
  - detecting the magnetic field penetrating the magnetic field sensor structure and providing a reference signal based on the magnetic field by the magnetic field auxiliary sensor structure; and
  - determining a deviation of the alignment of the magnetic field of the reference magnet by comparing the reference signal with a set signal corresponding to a predetermined magnetic field distribution of the magnetic field in the detection plane of the magnetic field auxiliary sensor structure.

24. The method according to claim 23, wherein the magnetic field auxiliary sensor structure is a Hall sensor, and the magnetic field main sensor structure is a tunnel magnetoresistance (TMR), a giant magnetoresistance (GMR) or an anisotropic magnetoresistance (AMR) sensor structure.

25. The method according to claim 1, further comprising:
- protecting a sensor arrangement comprising a sensor chip with the permanently magnetizable element against an external primary magnetic field, the protecting further comprising:
- generating a secondary magnetic field opposing the external primary magnetic field at the sensor chip.

26. The method according to claim 25, wherein in generating the opposing secondary magnetic field, a compensation coil arranged around the sensor chip is electrically excited by a current proportional to the external primary magnetic field.

27. The method according to claim 25, wherein a compensation coil and a primary coil are connected in series and wherein in generating the opposing secondary magnetic field, the primary coil and the compensation coil carry the same excitation current.

28. The method according to claim 25, wherein generating the opposing secondary magnetic field is performed such that parts of a metallic chip frame carrier on which the sensor chip is arranged, carry an appropriate current, so that the secondary magnetic field opposing the external primary magnetic field is generated tangentially to a sensor chip surface.

29. The method according to claim 25, wherein generating the secondary magnetic field is performed such that the sensor chip is surrounded by a short-circuited compensation coil, so that in a fast external primary magnetic field change a secondary magnetic field opposing the primary magnetic field is generated.

30. The apparatus according to claim 9, further comprising:
- a protective apparatus for protecting a sensor arrangement comprising a sensor chip with the permanently magnetizable element against an external primary magnetic field, protective apparatus further comprising:
  - a means for generating a secondary magnetic field opposing the external primary magnetic field at the sensor chip.

31. The apparatus according to claim 30, wherein the means for generating comprises a compensation coil in which the sensor chip is arranged, and wherein the compensation coil carries an excitation current proportional to the external primary magnetic field.

32. The apparatus according to claim 31, wherein the compensation coil is connected in series to a primary coil generating the external primary magnetic field and carrying the same excitation current.

33. The apparatus according to claim 30, wherein the sensor chip is arranged on a metallic chip frame carrier, and parts of the metallic chip frame carrier are implemented such that the parts generate a secondary magnetic field opposing the external primary magnetic field tangentially to a sensor chip surface when the parts carry an appropriate excitation current.

34. The apparatus according to claim 30, wherein the means for generating comprises a short-circuited compensation coil in which the sensor chip is arranged.

35. The apparatus according to claim 34, wherein the short-circuit compensation coil is integrated in the sensor chip.

36. The apparatus according to claim 35, wherein the short-circuit compensation coil integrated in the sensor chip is implemented such that the sensor is fully covered and slightly overlapped by upper and lower metal sheets connected via contacts.

37. The apparatus according to claim 36, wherein the upper and lower metal sheets are connected to each other via a transistor.

* * * * *